(12) United States Patent
Han et al.

(10) Patent No.: US 10,950,649 B2
(45) Date of Patent: Mar. 16, 2021

(54) BACKSIDE ILLUMINATED IMAGE SENSOR AND METHOD OF MANUFACTURING THE SAME

(71) Applicant: DB HITEK CO., LTD., Seoul (KR)

(72) Inventors: Chang Hun Han, Icheon-si (KR); Sang Won Yun, Daegu (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/394,474

(22) Filed: Apr. 25, 2019

(65) Prior Publication Data
US 2019/0333947 A1 Oct. 31, 2019

(30) Foreign Application Priority Data
Apr. 27, 2018 (KR) .................. 10-2018-0049087

(51) Int. Cl.
*H01L 27/146* (2006.01)
*H01L 31/0216* (2014.01)
(52) U.S. Cl.
CPC .... *H01L 27/1464* (2013.01); *H01L 27/14621* (2013.01); *H01L 27/14627* (2013.01); *H01L 27/14687* (2013.01); *H01L 31/02161* (2013.01)
(58) Field of Classification Search
CPC .......... H01L 27/1464; H01L 27/14621; H01L 27/14627; H01L 27/14636; H01L 27/14623; H01L 27/1461
See application file for complete search history.

(56) References Cited

U.S. PATENT DOCUMENTS

| | | | |
|---|---|---|---|
| 9,673,239 B1* | 6/2017 | Chu | H01L 27/14685 |
| 10,217,783 B2* | 2/2019 | Borthakur | H01L 27/1463 |
| 10,217,787 B2 | 2/2019 | Han | |
| 2011/0024867 A1* | 2/2011 | Tseng | H01L 24/05 257/459 |
| 2012/0205769 A1* | 8/2012 | Tsai | H01L 27/14683 257/460 |
| 2013/0027598 A1* | 1/2013 | McCarten | H01L 27/1461 348/311 |
| 2013/0265472 A1* | 10/2013 | Manabe | H01L 27/14609 348/308 |
| 2016/0300962 A1* | 10/2016 | Borthakur | H01L 27/14636 |
| 2018/0190696 A1* | 7/2018 | Lee | H01L 27/14636 |
| 2019/0067345 A1* | 2/2019 | Qi | H01L 27/14689 |

* cited by examiner

*Primary Examiner* — Julia Slutsker
(74) *Attorney, Agent, or Firm* — Patterson Thuente Pedersen, P.A.

(57) ABSTRACT

A backside illuminated image sensor includes pixel regions disposed in a substrate, an insulating layer disposed on a frontside surface of the substrate, a bonding pad disposed on a frontside surface of the insulating layer, and an anti-reflective layer disposed on a backside surface of the substrate. The substrate has a first opening for partially exposing a backside surface of the bonding pad, the insulating layer has a second opening for partially exposing the backside surface of the bonding pad, and the anti-reflective layer has a first portion extending along an inner side surface of the first opening.

9 Claims, 22 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2018-0049087, filed on Apr. 27, 2018, and all the benefits accruing therefrom under 35 U.S.C. § 119, the contents of which are incorporated by reference in their entirety.

TECHNICAL FIELD

The instant application related generally to display devices including backside illuminated image sensors and design of semiconductor devices for the same.

BACKGROUND

The present disclosure relates to a backside illuminated image sensor and a method of manufacturing the same.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may have an improved light-receiving efficiency in comparison with the frontside illuminated image sensor. The backside illuminated image sensor may include pixel regions in a substrate, transistors formed on a frontside surface of the substrate, an insulating layer formed on the transistors, bonding pads on the insulating layer, an anti-reflective layer formed on a backside surface of the substrate, a light-blocking pattern formed on the anti-reflective layer, a planarization layer formed on the light-blocking pattern, a color filter layer formed on the planarization layer, and micro lens array formed on the color filter layer.

The bonding pads may be exposed by openings formed through the substrate and the insulating layer. Wires may be bonded to the bonding pads through the opening or solder bumps may be formed on backside surfaces of the bonding pads. Further, a protective layer may be formed to protect inner surfaces of the openings and to electrically isolate the substrate from the bonding pads.

The openings may be formed after forming the anti-reflective layer or the planarization layer. Accordingly, the protective layer may be formed on the inner surfaces of the openings and the anti-reflective layer or planarization layer. As a result, the distance between the pixel regions and the micro lens array may be increased by the protective layer, and the sensitivity and crosstalk of the backside illuminated image sensor may thus be diminished.

SUMMARY

The present disclosure provides a backside illuminated image sensor having an improved structure and a method of manufacturing the backside illuminated image sensor.

In accordance with an aspect of the present disclosure, a backside illuminated image sensor may include pixel regions disposed in a substrate, an insulating layer disposed on a frontside surface of the substrate, a bonding pad disposed on a frontside surface of the insulating layer, and an anti-reflective layer disposed on a backside surface of the substrate, wherein the substrate may have a first opening for partially exposing a backside surface of the bonding pad, the insulating layer may have a second opening for partially exposing the backside surface of the bonding pad, and the anti-reflective layer may have a first portion extending along an inner side surface of the first opening.

In accordance with some exemplary embodiments of the present disclosure, the first opening may have a width wider than that of the second opening, and the anti-reflective layer may have a second portion disposed on a backside surface portion of the insulating layer exposed by the first opening.

In accordance with some exemplary embodiments of the present disclosure, the first opening may have the same width as the second opening, and the anti-reflective layer may have a second portion extending along an inner side surface of the second opening.

In accordance with some exemplary embodiments of the present disclosure, the backside illuminated image sensor may further include a second bonding pad disposed on the anti-reflective layer, an inner side surface of the second opening and a backside surface portion of the bonding pad exposed by the second opening.

In accordance with some exemplary embodiments of the present disclosure, the backside illuminated image sensor may further include a light-blocking pattern disposed on the anti-reflective layer and having third openings corresponding to the pixel regions.

In accordance with some exemplary embodiments of the present disclosure, the second bonding pad may be made of the same material as the light-blocking pattern.

In accordance with some exemplary embodiments of the present disclosure, the backside illuminated image sensor may further include a third bonding pad disposed on the second bonding pad.

In accordance with some exemplary embodiments of the present disclosure, the anti-reflective layer may comprise a metal oxide layer disposed on the backside surface of the substrate, a silicon oxide layer disposed on the metal oxide layer, and a silicon nitride layer disposed on the silicon oxide layer.

In accordance with some exemplary embodiments of the present disclosure, each of the pixel regions may comprise a charge accumulation region disposed in the substrate, and a frontside pinning layer disposed between a frontside surface of the substrate and the charge accumulation region.

In accordance with some exemplary embodiments of the present disclosure, the each of the pixel regions may further comprise a backside pinning layer disposed between the backside surface of the substrate and the charge accumulation region.

In accordance with another aspect of the present disclosure, a method of manufacturing a backside illuminated image sensor may include forming pixel regions in a substrate, forming an insulating layer on a frontside surface of the substrate, forming a bonding pad on a frontside surface of the insulating layer, partially removing the substrate to form a first opening exposing a backside surface portion of the insulating layer, forming anti-reflective layer on a backside surface of the substrate, an inner side surface of the first opening and the backside surface portion of the insulating layer exposed by the first opening, and partially removing the anti-reflective layer and the insulating layer to form a second opening exposing a backside surface portion of the bonding pad.

In accordance with some exemplary embodiments of the present disclosure, the method may further include forming a second bonding pad on the anti-reflective layer, an inner side surface of the second opening and the backside surface portion of the bonding pad exposed by the second opening.

In accordance with some exemplary embodiments of the present disclosure, the method may further include forming a light-blocking pattern having third openings corresponding to the pixel regions on the anti-reflective layer.

In accordance with some exemplary embodiments of the present disclosure, the method may further include forming a metal layer on the anti-reflective layer, and patterning the metal layer to form a second bonding pad connected with the bonding pad and a light-blocking pattern having third openings corresponding to the pixel regions.

In accordance with some exemplary embodiments of the present disclosure, the method include further include forming a second metal layer on the metal layer, and patterning the second metal layer to form a third bonding pad, wherein the second bonding pad and the light-blocking pattern may be formed after the third bonding pad is formed.

In accordance with some exemplary embodiments of the present disclosure, forming the anti-reflective layer may include forming a metal oxide layer on the backside surface of the substrate, the inner side surface of the first opening and the backside surface portion of the insulating layer exposed by the first opening, forming a silicon oxide layer on the metal oxide layer, and forming a silicon nitride layer of the silicon oxide layer.

In accordance with some exemplary embodiments of the present disclosure, forming the pixel regions may include forming charge accumulation regions in the substrate, and forming frontside pinning layers between the frontside surface of the substrate and the charge accumulation regions.

In accordance with some exemplary embodiments of the present disclosure, forming the pixel regions may further include forming backside pinning layers between the backside surface of the substrate and the charge accumulation regions.

In accordance with still another aspect of the present disclosure, a method of manufacturing a backside illuminated image sensor may include forming pixel regions in a substrate, forming an insulating layer on a frontside surface of the substrate, forming a bonding pad on a frontside surface of the insulating layer, partially removing the substrate to form a first opening exposing a backside surface portion of the insulating layer, partially removing the insulating layer to form a second opening exposing a backside surface portion of the bonding pad, forming anti-reflective layer on a backside surface of the substrate, an inner side surface of the first opening, an inner side surface of the second opening and the backside surface portion of the bonding pad exposed by the second opening, and partially removing the anti-reflective layer to partially expose a backside surface of the bonding pad.

In accordance with some exemplary embodiments of the present disclosure, the first opening may have the same width as the second opening.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
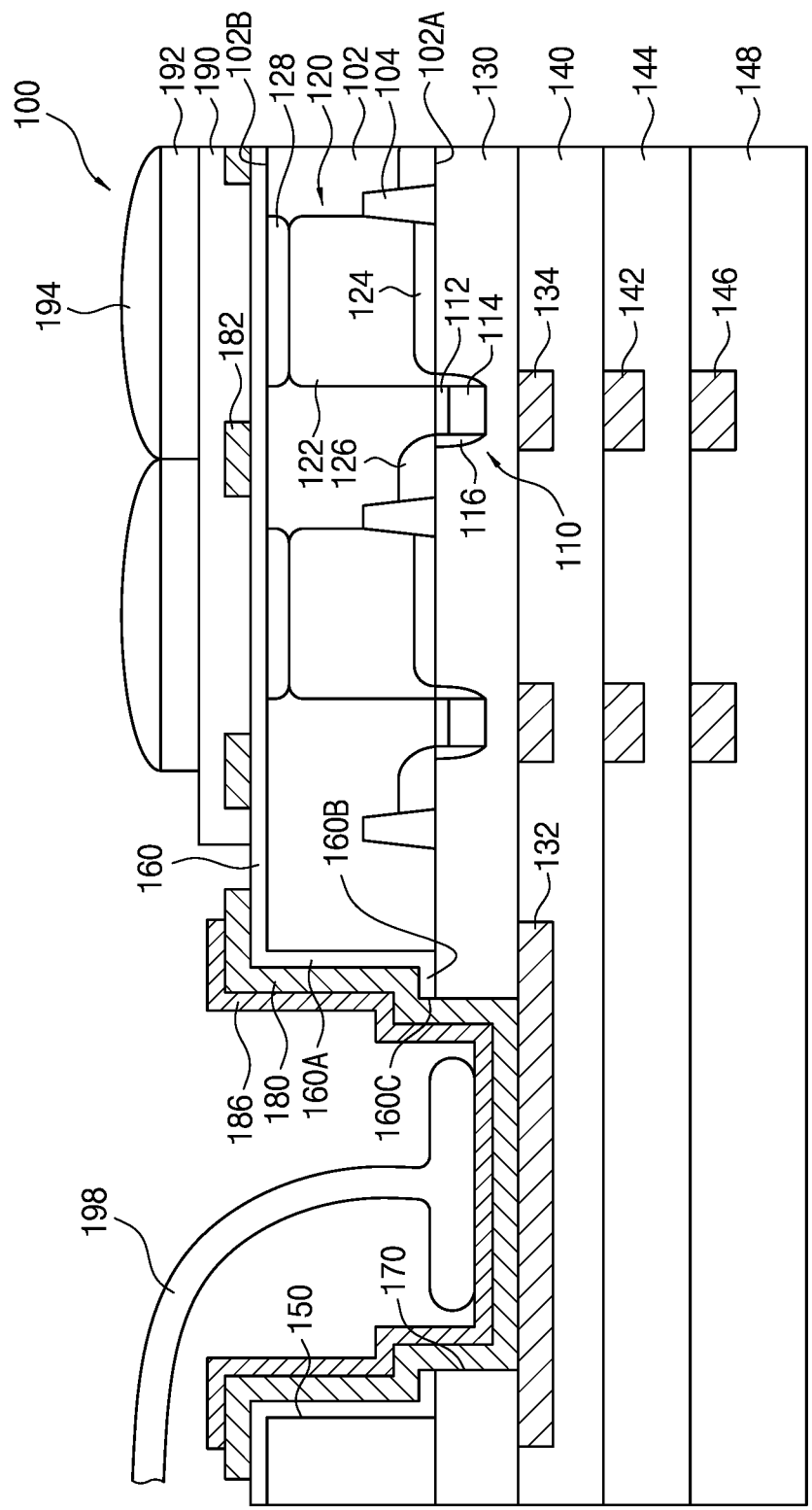
FIG. 1 is a cross-sectional view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter or as defined by the claims.

DETAILED DESCRIPTION OF THE DRAWINGS

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms. The term "between" is used herein to describe both mechanical arrangements (i.e., that an object is physically between two others in some dimension) or alternatively that it is in between two other components in an electrical connection.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not limited to the specific forms or areas in the drawings, and should be understood to include deviations of the exact forms shown and described. The areas may be entirely schematic, and their forms may not describe or depict accurate forms or structures in any given area or other dimensions, and are not intended to limit the scope of the present invention.

Figure 2:
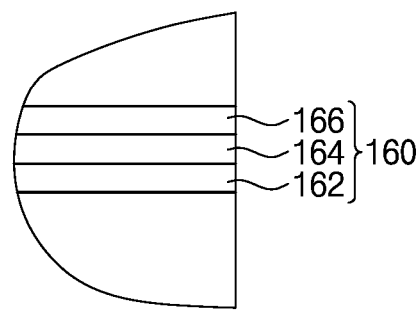
FIG. 2 is an enlarged cross-sectional view illustrating an anti-reflective layer as shown in FIG. 1.

FIG. 1 is a cross-sectional view illustrating a backside illuminated image sensor in accordance with an exemplary embodiment of the present disclosure, and FIG. 2 is an enlarged cross-sectional view illustrating an anti-reflective layer 160 as shown in FIG. 1.

Referring to FIG. 1, a backside illuminated image sensor 100, in accordance with an exemplary embodiment of the present disclosure, may include pixel regions 120 disposed in a substrate 102, an insulating layer 130 disposed on a frontside surface 102A of the substrate 102, a bonding pad 132 disposed on a frontside surface of the insulating layer 130, and the anti-reflective layer 160 disposed on a backside surface 102B of the substrate 102. Particularly, the substrate 102 may have a first opening defined between opening walls 150 for partially exposing a backside surface of the bonding pad 132, and the insulating layer 130 may further have a second opening defined between opening walls 170 for partially exposing the backside surface of the bonding pad 132. For ease of reference, throughout this application the "first opening" shall be referred to by reference number 150, which points to the walls thereof. Likewise, "second opening" shall be referred to by reference 170, which points to the walls thereof.

The anti-reflective layer 160 may extend along an inner side surface of the first opening 150. That is, the anti-reflective layer 160 may have a first portion 160A formed on the inner side surface of the first opening 150 so as to protect the substrate 102 and to electrically isolate the substrate 102 from a wire 198 or a solder bump (not shown) electrically connected with the bonding pad 132. The first opening 150 may have a width wider than that of the second opening 170, and the anti-reflective layer 160 may have a second portion 160B disposed on a backside surface portion of the insulating layer 130 exposed by the first opening 150. Further, the anti-reflective layer 160 may define a through-hole 160C (i.e., an absence of anti-reflective material) to connect the first opening 150 and the second opening 170.

The backside illuminated image sensor 100 may include a second bonding pad 180 disposed on the anti-reflective layer 160, an inner side surface of the second opening 170 and a backside surface portion of the bonding pad 132 exposed by the second opening 170. Further, the backside illuminated image sensor 100 may include a light-blocking pattern 182 disposed on the anti-reflective layer 160 and having third openings 184 (refer to FIG. 14) corresponding to the pixel regions 120. Particularly, the second bonding pad 180 may be made of the same material as the light-blocking pattern 182. For example, the second bonding pad 180 and the light-blocking pattern 182 may be made of a metallic material, e.g., tungsten.

The backside illuminated image sensor 100 may include a third bonding pad 186 disposed on the second bonding pad 180. For example, the third bonding pad 186 may be made of copper or aluminum. Further, though not shown in FIG. 1, a titanium layer and a titanium nitride layer serving as a diffusion barrier layer and an adhesive layer may be formed between the bonding pad 132 and the second bonding pad 180.

A planarization layer 190 may be disposed on the anti-reflective layer 160 and the light-blocking pattern 182, and a color filter layer 192 and a micro lens array 194 may be disposed on the planarization layer 190. For example, the planarization layer 190 may be made of silicon oxide or photoresist material.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface 102A portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on the frontside surface 102A of the substrate 102, a gate electrode 114 disposed on the gate insulating layer 112, and gate spacers 116 disposed on side surfaces of the gate electrode 114. Further, though not shown in FIG. 1, the backside illuminated image sensor 100 may include reset transistors, source follower transistors, and select transistors electrically connected with the floating diffusion regions 126.

Alternatively, if the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

The pixel regions 120 may include a frontside pinning layer 124 disposed between the frontside surface 102A of the substrate 102 and the charge accumulation region 122, respectively. Further, the pixel regions 120 may include a backside pinning layer 128 disposed between the backside surface 102B of the substrate 102 and the charge accumulation region 122, respectively. The frontside and backside pinning layers 124 and 128, respectively, may have the first conductivity type. For example, p-type impurity diffusion regions may be used as the frontside and backside pinning layers 124 and 128.

A first wiring layer 134 may be disposed on the insulating layer 130 and may be electrically connected with the pixel regions 120. The first wiring layer 134 may be made of the same material as the bonding pad 132.

Further, a second insulating layer 140 may be disposed on a frontside surface of the insulating layer 130, the bonding pad 132 and the first wiring layer 134, and a second wiring layer 142 may be disposed on the second insulating layer 140. A third insulating layer 144 may be disposed on the second insulating layer 140 and the second wiring layer 142, and a third wiring layer 146 may be disposed on the third insulating layer 144. A passivation layer 148 may be disposed on the third insulating layer 144 and the third wiring layer 146.

FIG. 2 is a detailed, partial view of the anti-reflective layer of FIG. 1. Referring to FIG. 2, the anti-reflective layer 160 may include a metal oxide layer 162 disposed on the backside surface 102B of the substrate 102, a silicon oxide layer 164 disposed on the metal oxide layer 162, and a silicon nitride layer 166 disposed on the silicon oxide layer 164. It should be understood that in alternative embodiments different specific materials could be used to accomplish the anti-reflective effect of the layer 160.

The metal oxide layer 162 may function as a fixed charge layer. For example, the metal oxide layer 162 may function as a negative fixed charge layer and include hafnium oxide ($HfO_2$), hafnium oxynitride (HfON), aluminum oxide ($Al_2O_3$), aluminum oxynitride (AlON), hafnium aluminum oxide (HfAlO) or hafnium aluminum oxynitride (HfAlON), for example. In such case, negative charges of the negative fixed charge layer may form a negatively charged shallow minority carrier rich region, i.e., a hole accumulation region, in a backside surface portion of the substrate 102, and the hole accumulation region may improve the function of the backside pinning layers 128.

Alternatively, when the charge accumulation region 122 has the first conductivity type, that is, an n-type substrate is used as the substrate 102 and the charge accumulation region 122 include p-type impurities, the metal oxide layer 162 may function as a positive fixed charge layer and include zirconium oxide ($ZrO_2$), hafnium silicon oxide ($HfSiO_2$), hafnium silicon oxynitride (HfSiON) or silicon nitride ($Si_3N_4$), for example. In such case, the positive fixed charge layer may form an electron accumulation region in a backside surface portion of the substrate 102.

Figure 3:
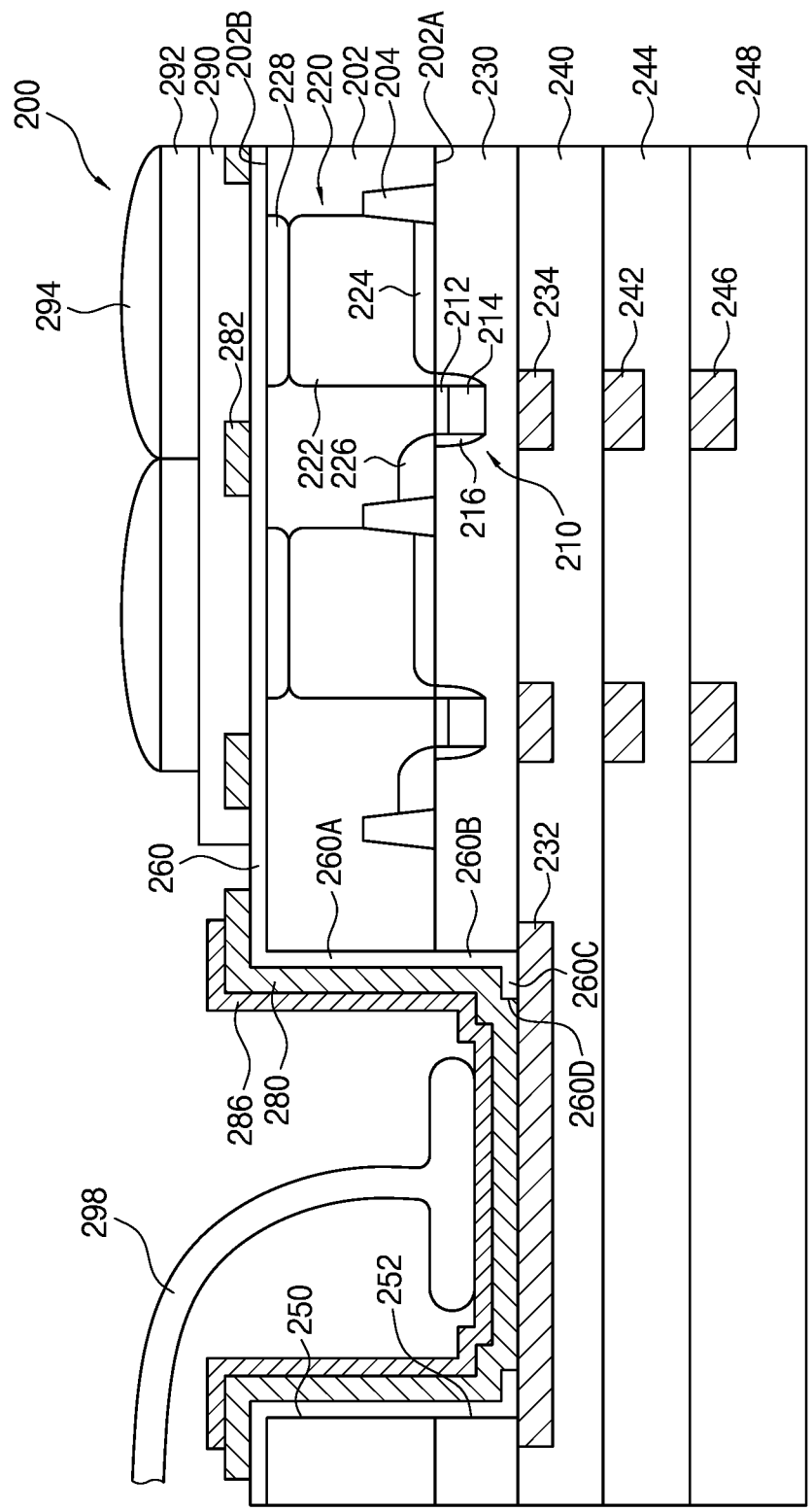
FIG. 3 is a cross-sectional view illustrating a backside illuminated image sensor in accordance with another embodiment of the present disclosure.

FIG. 3 is a cross-sectional view illustrating a backside illuminated image sensor in accordance with another embodiment of the present disclosure. Like components of FIG. 3 are referred to with reference numbers similar to those set forth in FIGS. 1 and 2, iterated by 100. Accordingly, not every component is described in as complete detail below, where doing so would be redundant with the description provided above for the similar components of the previously described embodiment.

Referring to FIG. 3, a backside illuminated image sensor 200, in accordance with another embodiment of the present disclosure, may include pixel regions 220 disposed in a substrate 202, an insulating layer 230 disposed on a frontside surface 202A of the substrate 202, a bonding pad 232 disposed on a frontside surface of the insulating layer 230, and an anti-reflective layer 260 disposed on a backside surface 202B of the substrate 202. Particularly, the substrate 202 may have a first opening 250 for partially exposing a backside surface of the bonding pad 232, the insulating layer 230 may have a second opening 252 for partially exposing the backside surface of the bonding pad 232.

The anti-reflective layer 260 may extend along an inner side surface of the first opening 250. That is, the anti-reflective layer 260 may have a first portion 260A formed on the inner side surface of the first opening 250 so as to protect the substrate 202 and to electrically isolate the substrate 202 from a wire 298 or a solder bump (not shown) electrically connected with the bonding pad 232. The first opening 250 may have the same width as the second opening 252, and the anti-reflective layer 260 may have a second portion 260B extending along an inner side surface of the second opening 252. Further, the anti-reflective layer 260 may have a third portion 260C disposed on a backside surface portion of the bonding pad 232 exposed by the second opening 252 and a through-hole 260D for exposing a backside surface portion of the bonding pad 232.

The backside illuminated image sensor 200 may include a second bonding pad 280 disposed on the anti-reflective layer 260 and the backside surface portion of the bonding pad 232 exposed by the second opening 252 and the through-hole 260D. Further, the backside illuminated image sensor 200 may include a light-blocking pattern 282 disposed on the anti-reflective layer 260 and having third openings 284 (refer to FIG. 21) corresponding to the pixel regions 220. Particularly, the second bonding pad 280 may be made of the same material as the light-blocking pattern 282. For example, the second bonding pad 280 and the light-blocking pattern 282 may be made of a metallic material, e.g., tungsten.

The backside illuminated image sensor 200 may include a third bonding pad 286 disposed on the second bonding pad 280. For example, the third bonding pad 286 may be made of copper or aluminum. Further, though not shown in FIG. 3, a titanium layer and a titanium nitride layer serving as a diffusion barrier layer and an adhesive layer may be formed between the bonding pad 232 and the second bonding pad 280.

A planarization layer 290 may be disposed on the anti-reflective layer 260 and the light-blocking pattern 282, and a color filter layer 292 and a micro lens array 294 may be disposed on the planarization layer 290. For example, the planarization layer 290 may be made of silicon oxide or a photoresist material, among others.

Each of the pixel regions 220 may include a charge accumulation region 222 and a floating diffusion region 226. Transfer gate structures 210 may be disposed on channel regions between the charge accumulation regions 222 and the floating diffusion regions 226. Each of the transfer gate structures 210 may include a gate insulating layer 212, a gate electrode 214 and gate spacers 216. Further, each of the pixel regions 220 may include a frontside pinning layer 224 and a backside pinning layer 228.

A first wiring layer 234 may be disposed on the insulating layer 230. A second insulating layer 240 may be disposed on a frontside surface of the insulating layer 230, the bonding pad 232 and the first wiring layer 234, and a second wiring layer 242 may be disposed on the second insulating layer 240. A third insulating layer 244 may be disposed on the second insulating layer 240 and the second wiring layer 242, and a third wiring layer 246 may be disposed on the third insulating layer 244. A passivation layer 248 may be disposed on the third insulating layer 244 and the third wiring layer 246.

FIGS. 4 to 15 are cross-sectional views illustrating a method of manufacturing the backside illuminated image sensor as shown in FIG. 1.

Figure 4:
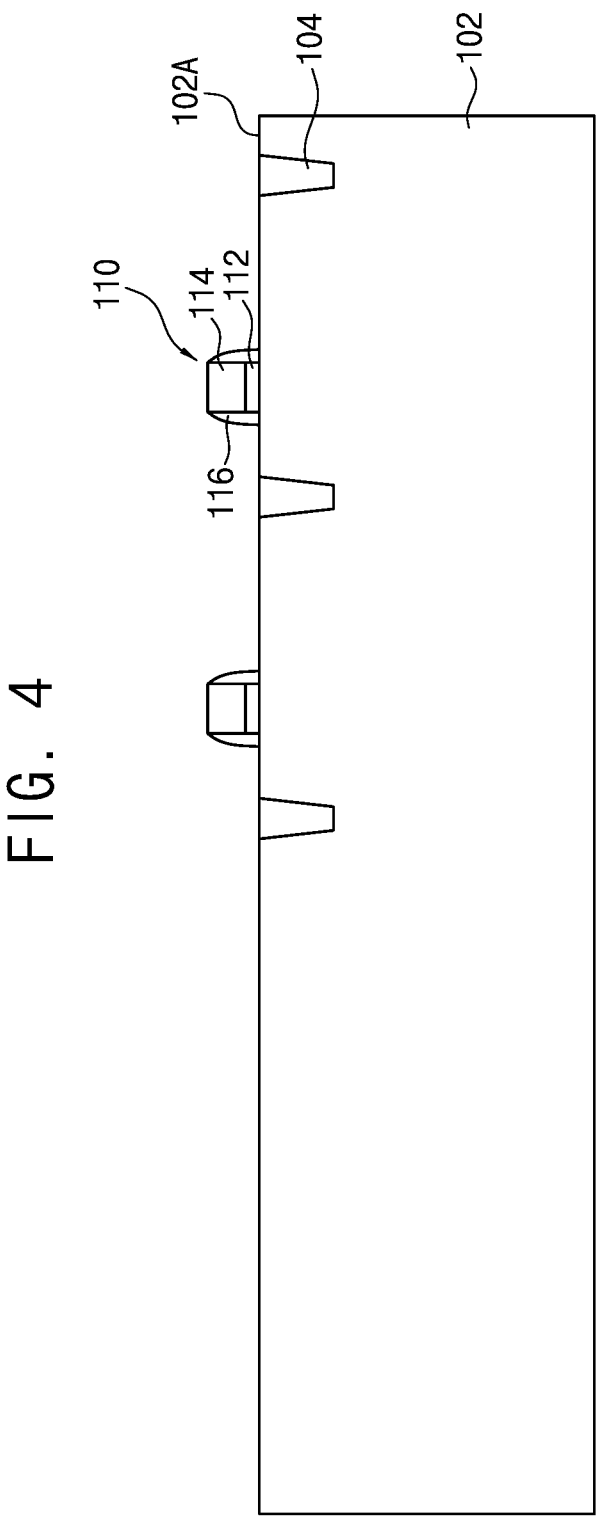
FIGS. 4 to 15 are cross-sectional views illustrating a method of manufacturing the backside illuminated image sensor as shown in FIG. 1.

Referring to FIG. 4, device isolation regions 104 may be formed in frontside surface portions of a substrate 102 (i.e., the portions arranged along frontside surface 102A) to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed by a Shallow Trench Isolation (STI) process.

After forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Figure 5:
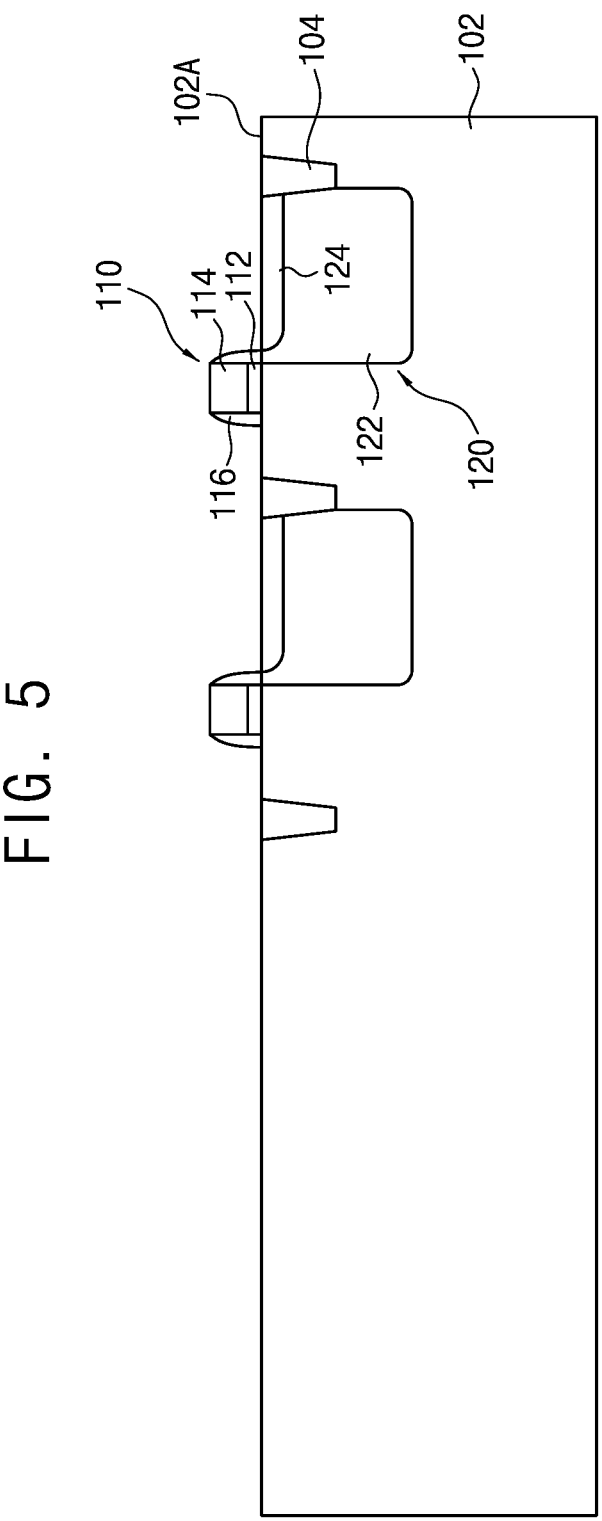

Referring to FIG. 5, charge accumulation regions 122 used as pixel regions 120 may be formed in the substrate 102. In detail, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process, in embodiments.

Frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 6:
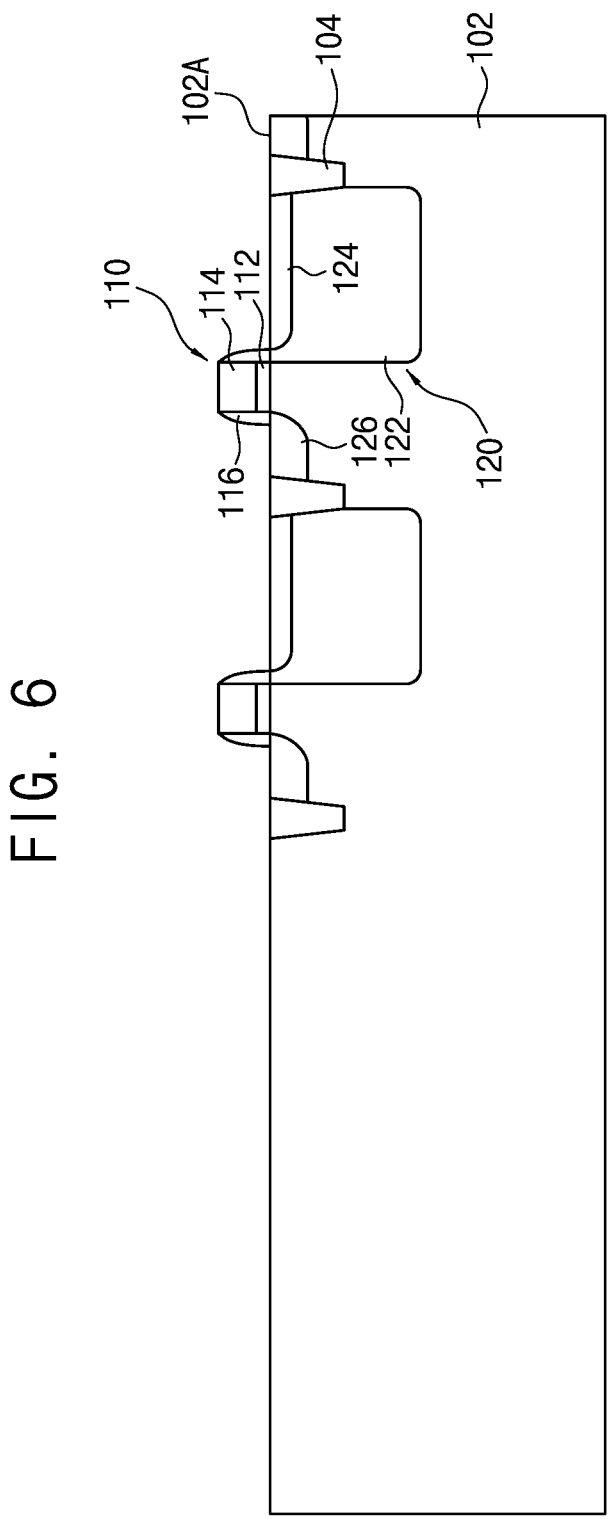

Referring to FIG. 6, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. At this time, the transfer gate structures 110 may be arranged on channel regions between the charge accumulation regions 122 and the floating diffusion regions 126.

Figure 7:
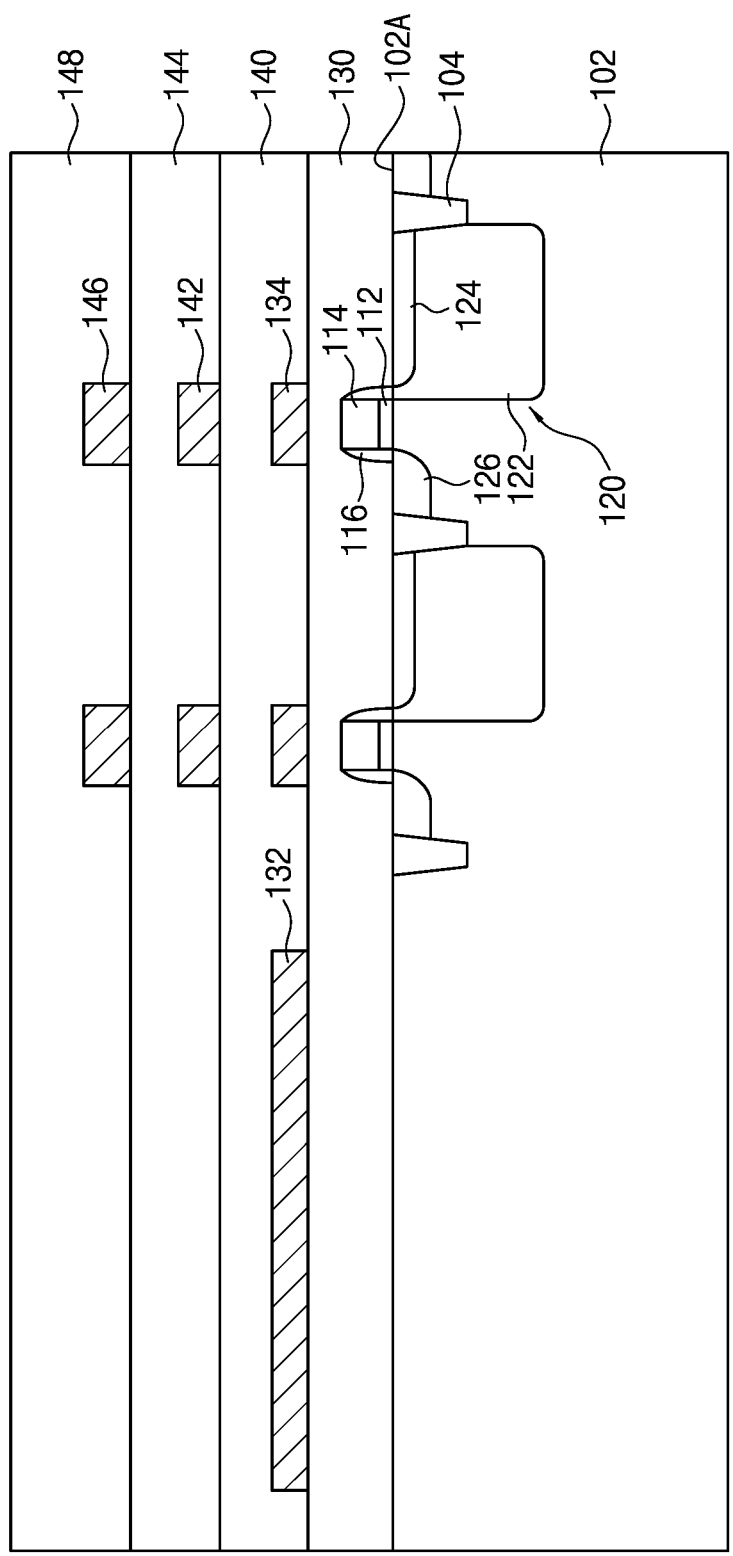

Referring to FIG. 7, an insulating layer 130 may be formed on the frontside surface 102A of the substrate 102, and a bonding pad 132 and a first wiring layer 134 may be formed on the insulating layer 130. The insulating layer 130 may be made of an insulating material such as silicon oxide, and the bonding pad 132 and the first wiring layer 134 may be made of a metallic material such as copper or aluminum. For example, a metal layer (not shown) may be formed on the insulating layer 130, and the bonding pad 132 and the first wiring layer 134 may then be formed by patterning the metal layer.

A second insulating layer 140 may be formed on the insulating layer 130, the bonding pad 132 and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A passivation layer 148 may be formed on the third insulating layer 144 and the third wiring layer 146. The first, second and third wiring layers 134, 142 and 146 may be electrically connected with the pixel regions 120, and the bonding pad 132 may be electrically connected with the first, second and third wiring layers 134, 142 and 146.

Figure 8:
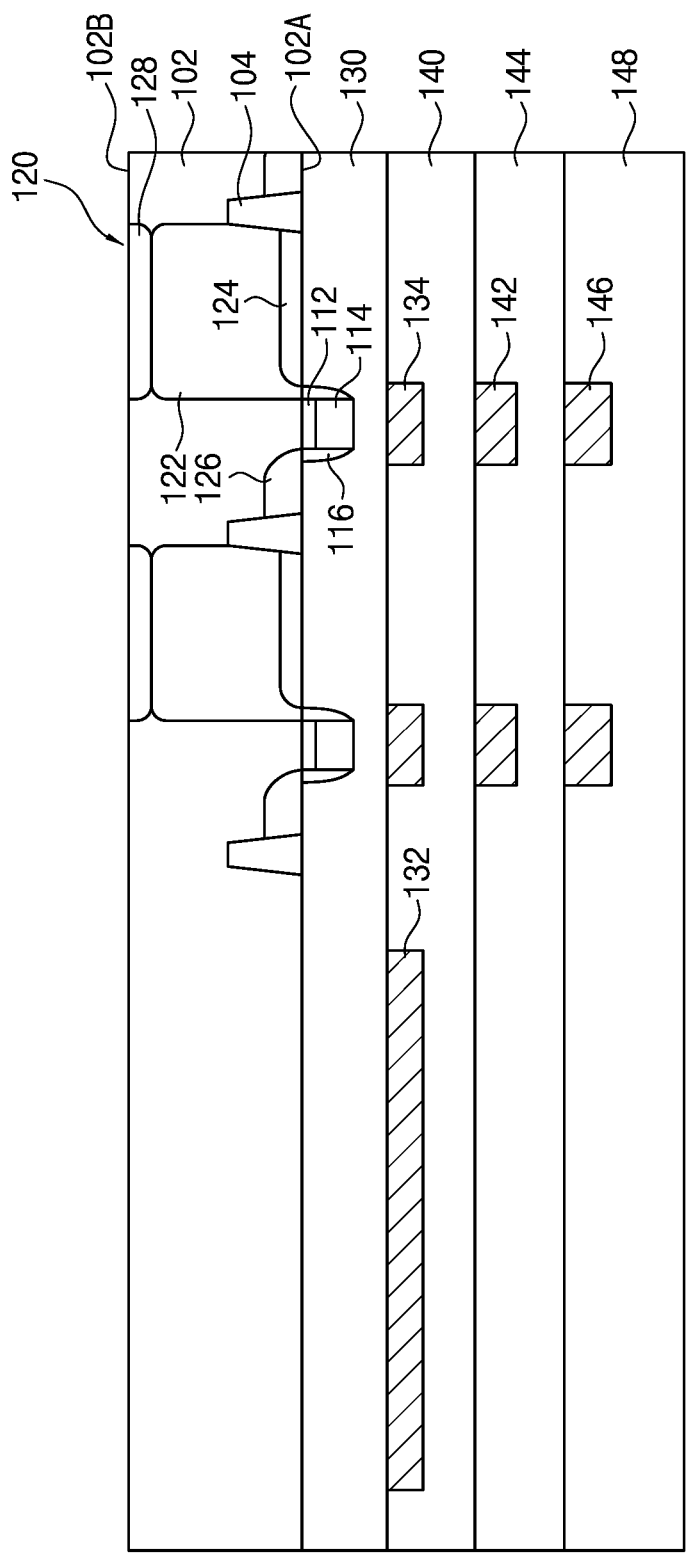

Referring to FIG. 8, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

In embodiments, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed. It will be understood to those of skill in the art that various orders of the steps described herein are contemplated, and not all steps must be performed in the order described.

Meanwhile, when the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 9:
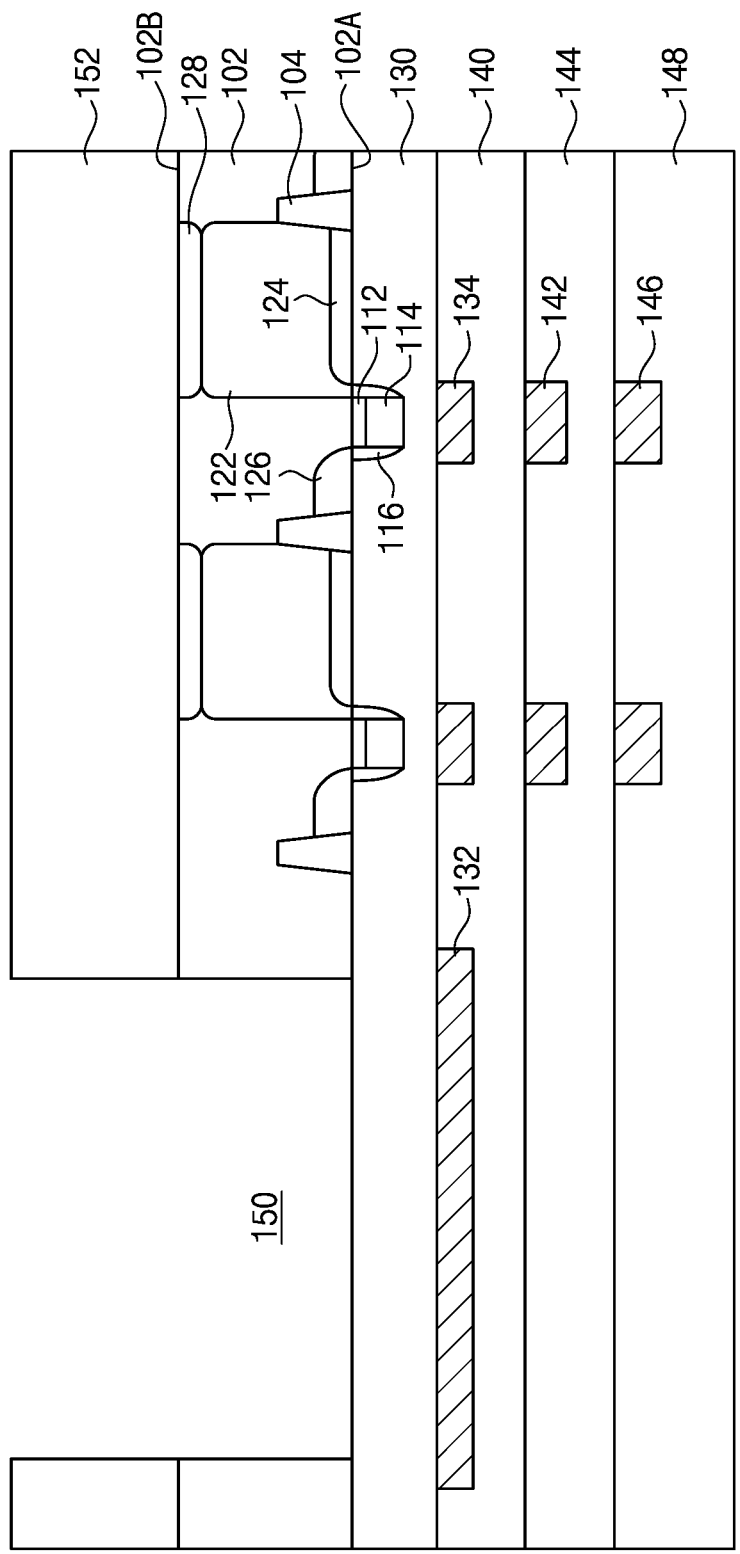

Referring to FIG. 9, the substrate 102 may be partially removed so as to form a first opening 150 partially exposing a backside surface of the insulating layer 130. For example, a first photoresist pattern 152 may be formed on the backside surface 102B of the substrate 102, which exposes a portion of the backside surface 102B of the substrate 102 to correspond to the bonding pad 132. The first opening 150 may be formed by an anisotropic etching process using the first photoresist pattern 152 as an etching mask. The first photoresist pattern 152 may be removed by an ashing or stripping process after forming the first opening 150.

Figure 10:
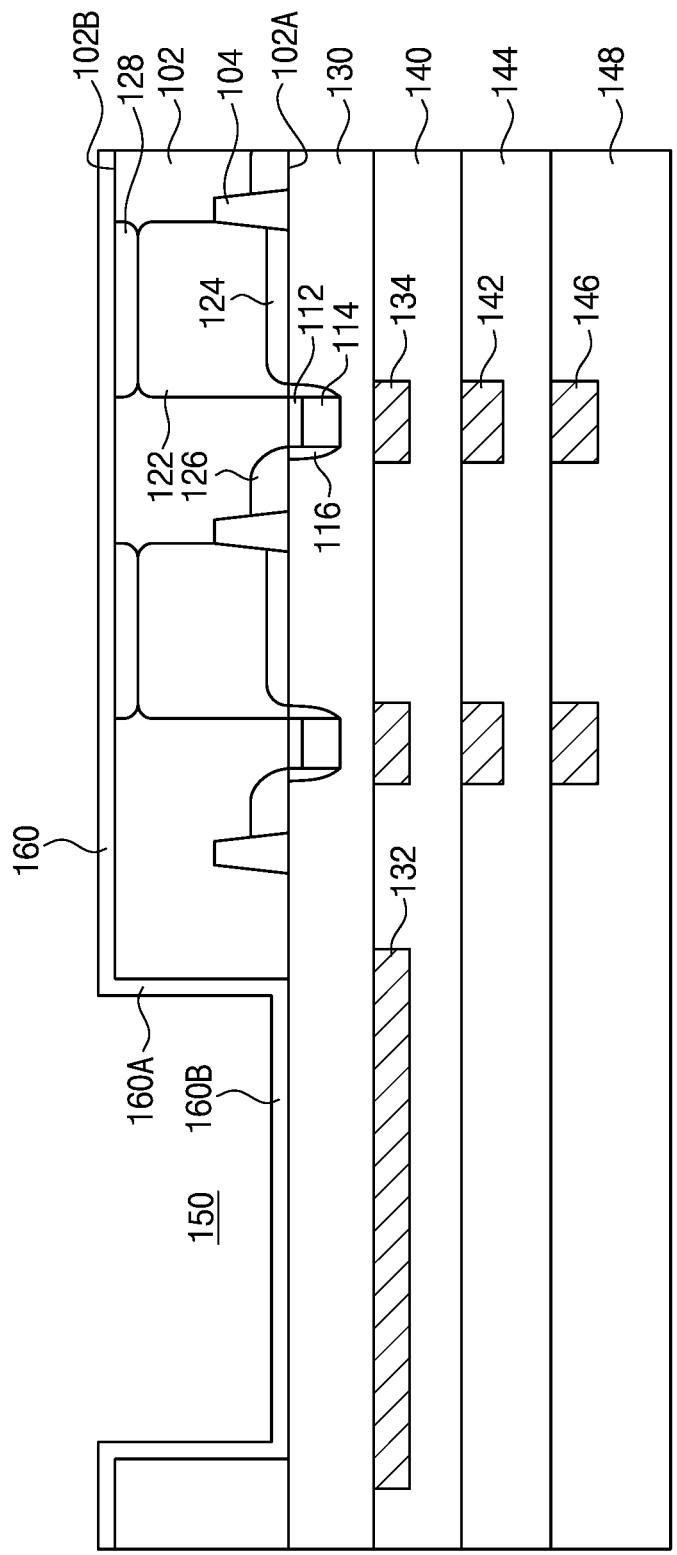

Referring to FIG. 10, an anti-reflective layer 160 may be formed on the backside surface 102B of the substrate 102, an inner side surface of the first opening 150, and a backside surface portion of the insulating layer 130 exposed by the first opening 150. Accordingly, the anti-reflective layer 160 may include a first portion 160A formed on the inner side surface of the first opening 150 and a second portion 160B formed on the backside surface portion of the insulating layer 130. For example, a metal oxide layer 162, a silicon oxide layer 164 and a silicon nitride layer 166 may be sequentially formed on the backside surface 102B of the substrate 102, the inner side surface of the first opening 150, and the backside surface portion of the insulating layer 130 exposed by the first opening 150. The metal oxide layer 162 may be formed by a Metal Organic Chemical Vapor Deposition (MOCVD) process or an Atomic Layer Deposition (ALD) process, and the silicon oxide layer 164 and the silicon nitride layer 166 may be formed by a Chemical Vapor Deposition (CVD) process.

Figure 11:
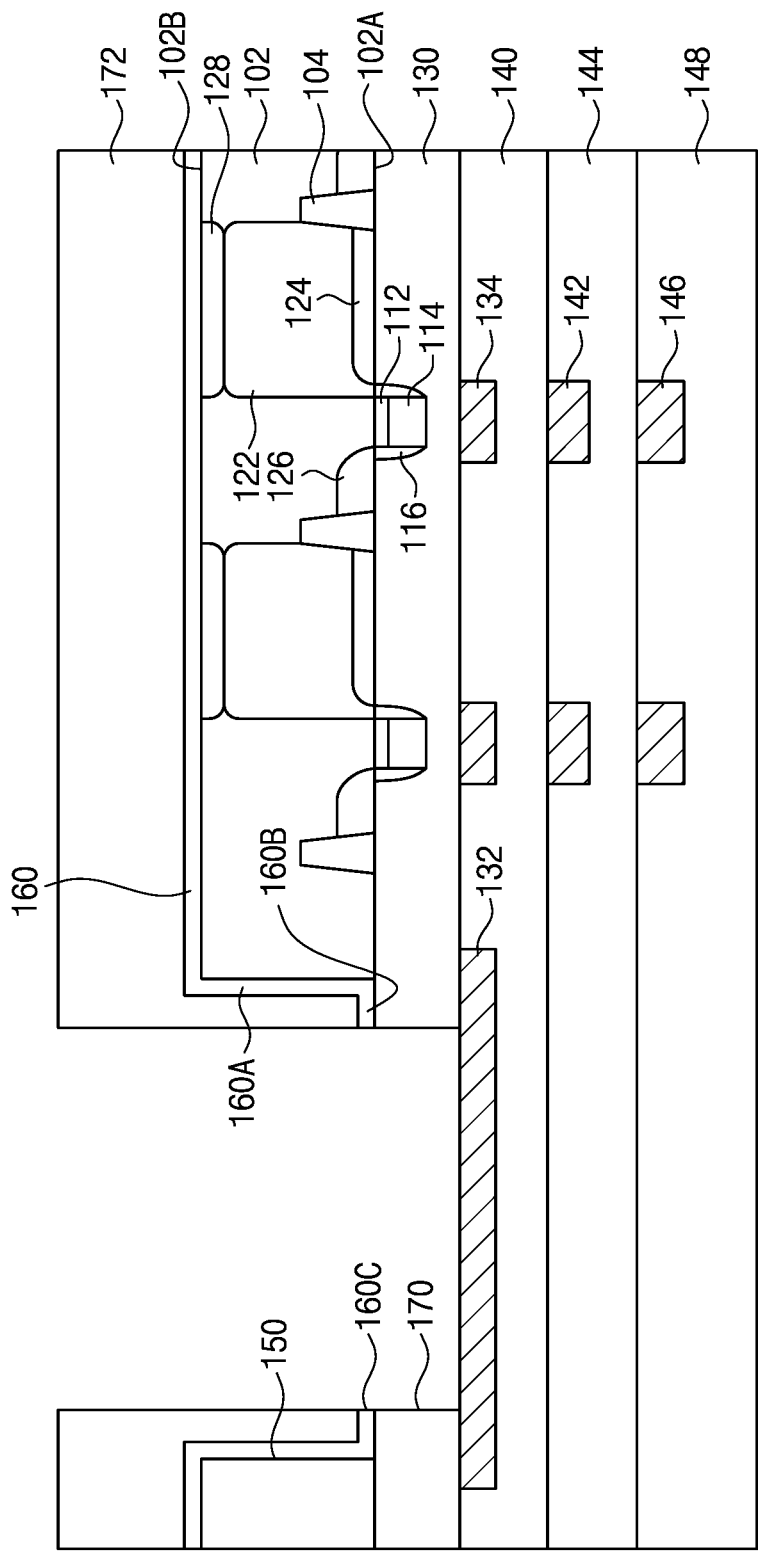

Referring to FIG. 11, the anti-reflective layer 160 and the insulating layer 130 may be partially removed so as to form a second opening 170 through which partially exposes a backside surface of the bonding pad 132. For example, a second photoresist pattern 172 may be formed on the anti-reflective layer 160, which partially exposes a second portion 160B of the anti-reflective layer 160. The second opening 170 may be formed by an anisotropic etching process using the second photoresist pattern 172 as an etching mask. Further, a through-hole 160C may be formed through the second portion 160B of the anti-reflective layer 160 by the anisotropic etching process. Particularly, the first opening 150 may have a width wider than that of the second opening 170 so as to prevent the first portion 160A of the anti-reflective layer 160 from being damaged during the anisotropic etching process. The second photoresist pattern 172 may be removed by an ashing or stripping process after forming the second opening 170.

Figure 12:
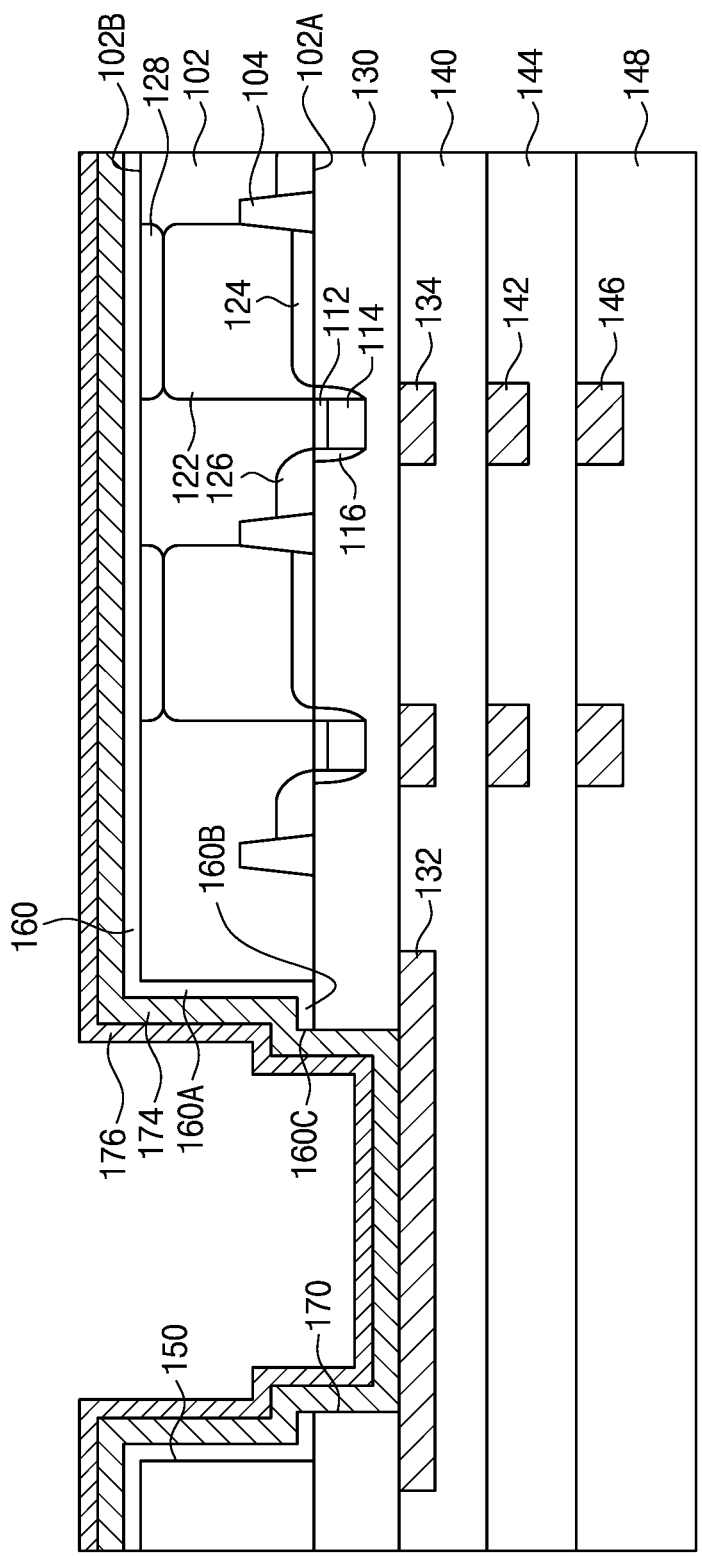
Figure 13:
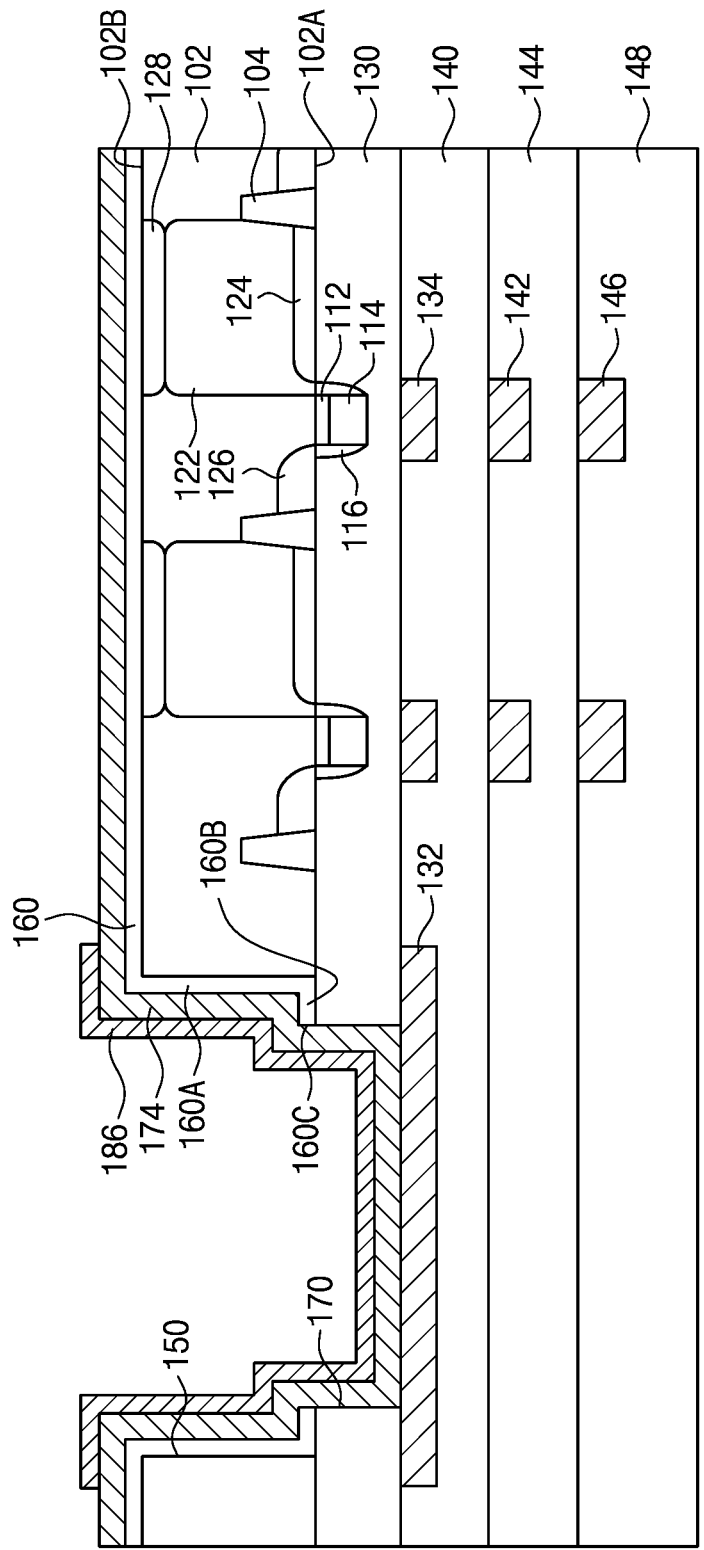
Figure 14:
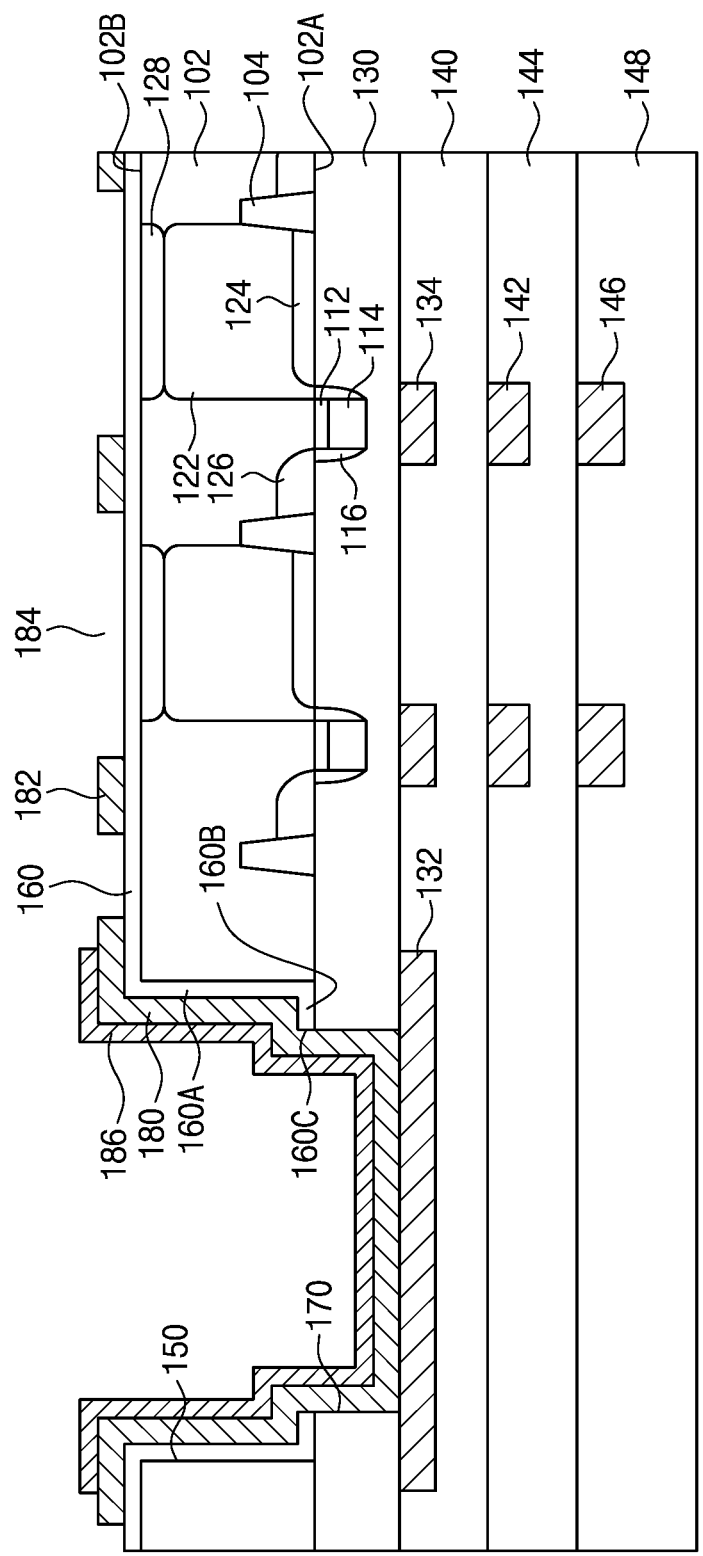

Referring to FIGS. 12 to 14, a second bonding pad 180 may be formed on the anti-reflective layer 160, an inner side surface of the second opening 170 and a backside surface portion of the bonding pad 132 exposed by the second opening 170, and a third bonding pad 186 may be formed on the second bonding pad 180. Further, a light-blocking pattern 182 having third openings 184 corresponding to the pixel regions 120 may be formed on the anti-reflective layer 160.

For example, as shown in FIG. 12, a first metal layer 174, e.g., a tungsten layer, may be formed on the anti-reflective layer 160, the inner side surface of the second opening 170 and the backside surface portion of the bonding pad 132, and a second metal layer 176, e.g., an aluminum layer, may be formed on the first metal layer 174. The third bonding pad 186 may be formed by patterning the second metal layer 176 as shown in FIG. 13, and the second bonding pad 180 and the light-blocking pattern 182 may be formed by patterning the first metal layer 174 as shown in FIG. 14.

Figure 15:
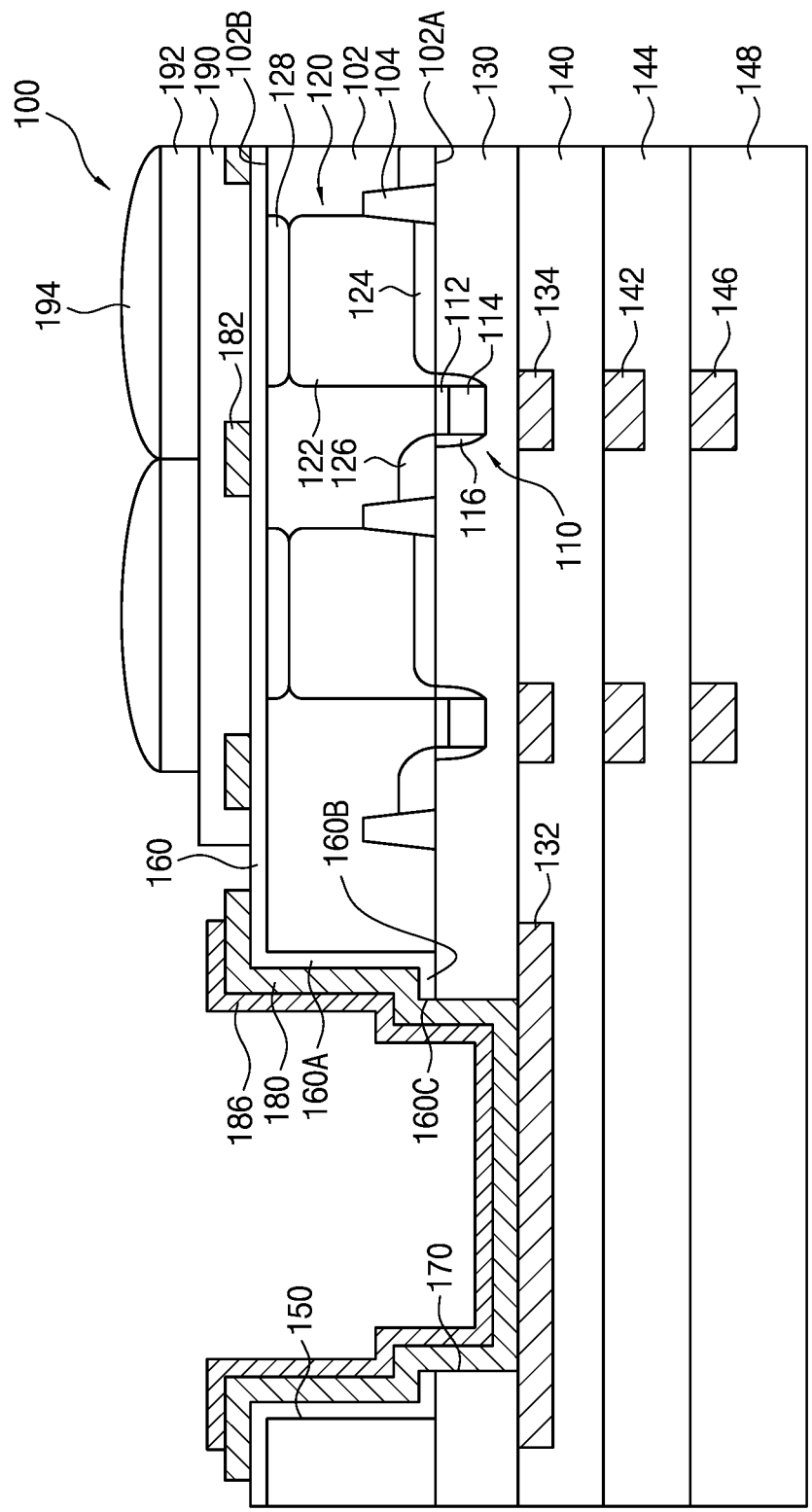

Referring to FIG. 15, a planarization layer 190 may be formed on the anti-reflective layer 160 and the light-blocking pattern 182, and a color filter layer 192 and a micro lens array 194 may be sequentially formed on the planarization layer 190. The planarization layer 190 may be made of an insulating material such as silicon oxide or photoresist material.

FIGS. 16 to 22 are cross-sectional views illustrating a method of manufacturing the backside illuminated image sensor as shown in FIG. 3.

Figure 16:
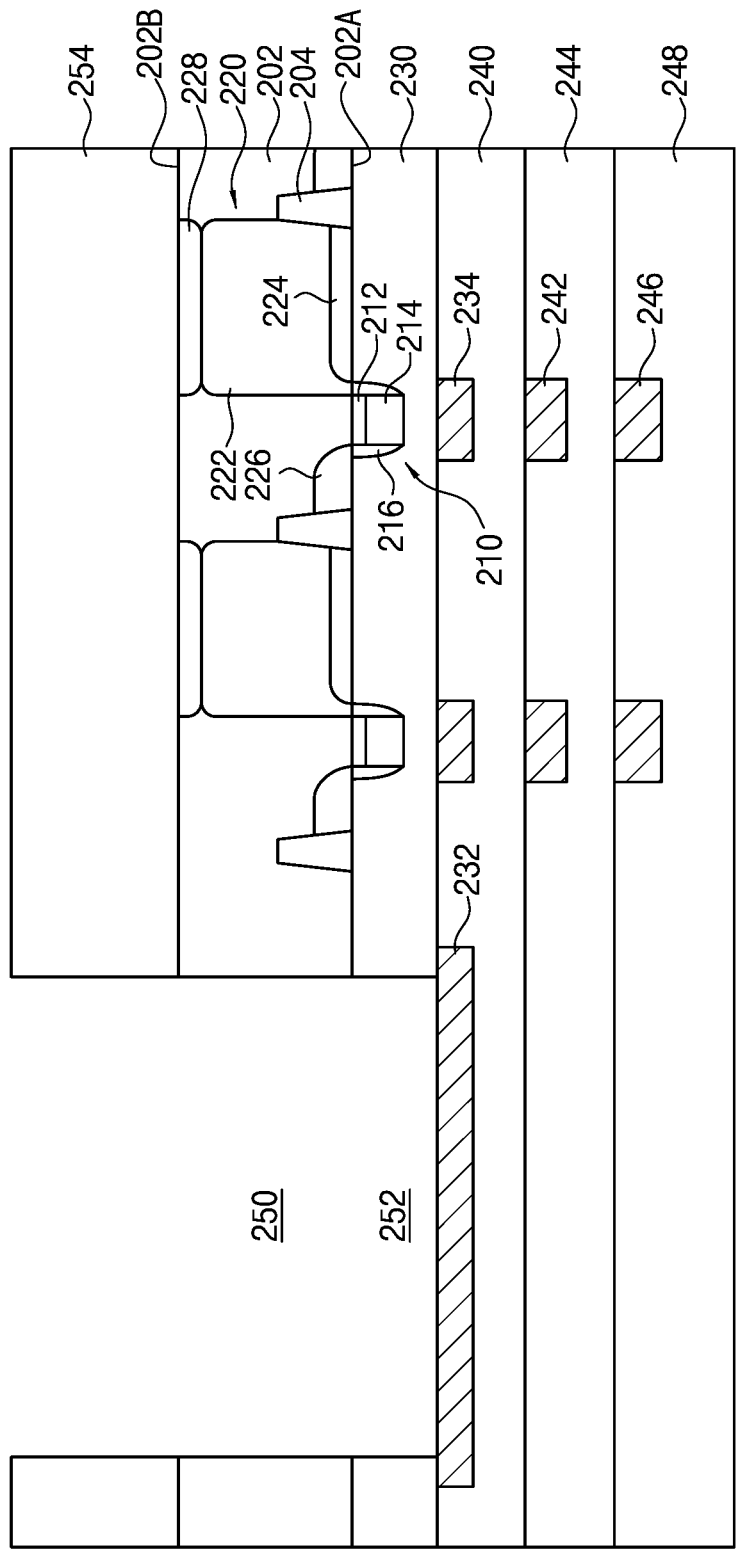
FIGS. 16 to 22 are cross-sectional views illustrating a method of manufacturing the backside illuminated image sensor as shown in FIG. 3.

Referring to FIG. 16, device isolation regions 204 may be formed in frontside surface portions of a substrate 202, and transfer gate structures 210 may be formed on a frontside surface 202A of the substrate 202. Each of the transfer gate structures 210 may include a gate insulating layer 212, a gate electrode 214 and gate spacers 216.

Pixel regions 220 may be formed in the substrate 202. In detail, charge accumulation regions 222 may be formed in the substrate 202, and frontside pinning layers 224 may be formed between the frontside surface 202A of the substrate 202 and the charge accumulation regions 222. Further, floating diffusion regions 226 may be formed in frontside surface portions of the substrate 202 to be spaced apart from the charge accumulation regions 222.

An insulating layer 230 may be formed on the frontside surface 202A of the substrate 202, and a bonding pad 232 and a first wiring layer 234 may be formed on the insulating layer 230. Then, a second insulating layer 240, a second wiring layer 242, a third insulating layer 244, a third wiring layer 246 and a passivation layer 248 may be sequentially formed.

Then, a back-grinding process or a chemical and mechanical polishing process may be performed so as to reduce a thickness of the substrate 202, and backside pinning layers 228 may be formed between a backside surface 202B of the substrate 202 and the charge accumulation regions 222.

Further, the substrate 202 may be partially removed so as to form a first opening 250 partially exposing a backside surface of the insulating layer 230, and the insulating layer 230 may be partially removed so as to form a second opening 252 partially exposing a backside surface of the bonding pad 232. For example, a first photoresist pattern 254 may be formed on the backside surface 202B of the substrate 202, which exposes a portion of the backside surface 202B of the substrate 202 to correspond to the bonding pad 232. The first opening 250 and the second opening 252 may be sequentially formed by an anisotropic etching process using the first photoresist pattern 254 as an etching mask. Thus, the first opening 250 and the second opening 252 may have the same width as shown in FIG. 16. The first photoresist pattern 254 may be removed by an ashing or stripping process after forming the first and second openings 250 and 252.

Figure 17:
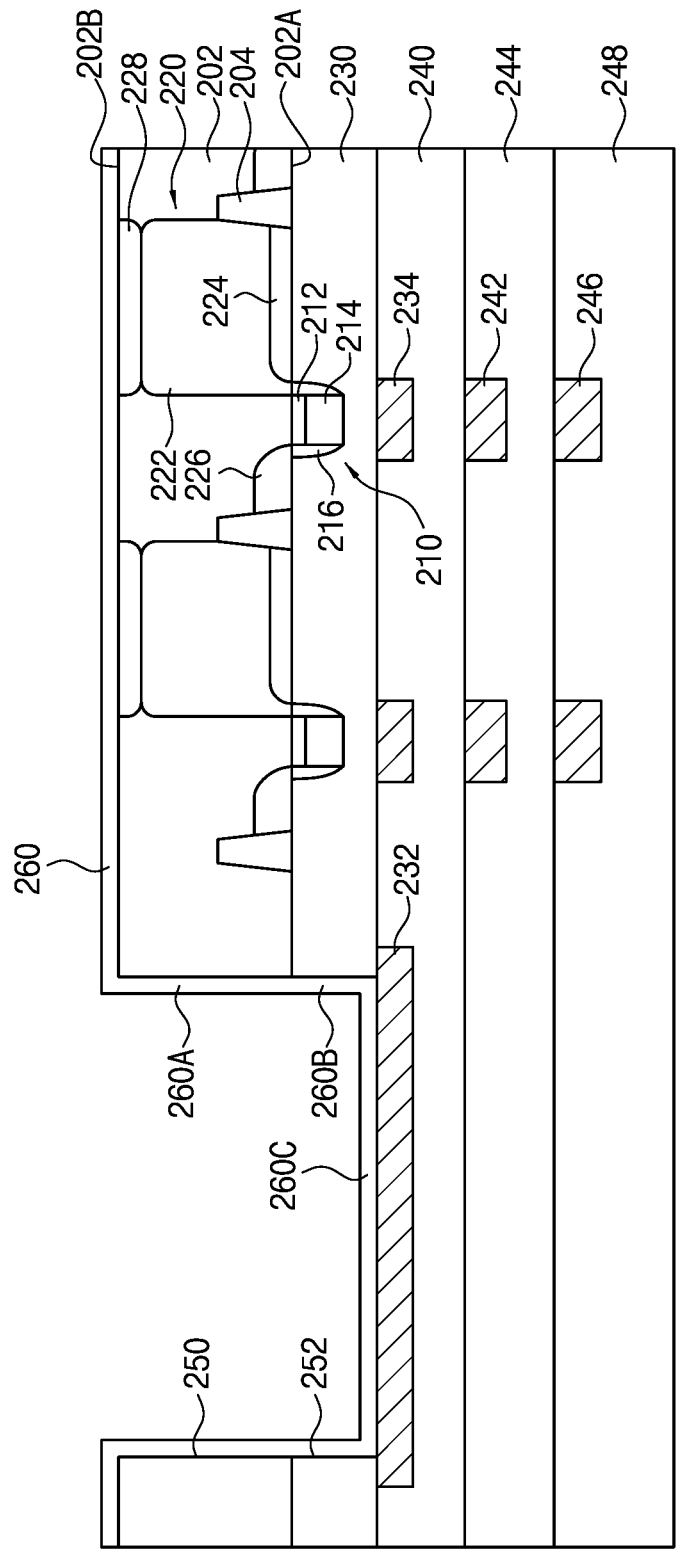

Referring to FIG. 17, an anti-reflective layer 260 may be formed on the backside surface 202B of the substrate 202, an inner side surface of the first opening 250, an inner side surface of the second opening 252 and a backside surface portion of the bonding pad 232 exposed by the first and second openings 250 and 252. Accordingly, the anti-reflective layer 260 may include a first portion 260A formed on the inner side surface of the first opening 250, a second portion 260B formed on the inner side surface of the second opening 252 and a third portion 260C formed on the backside surface portion of the bonding pad 232. The anti-reflective layer 260 may include a metal oxide layer, a silicon oxide layer and a silicon nitride layer.

Figure 18:
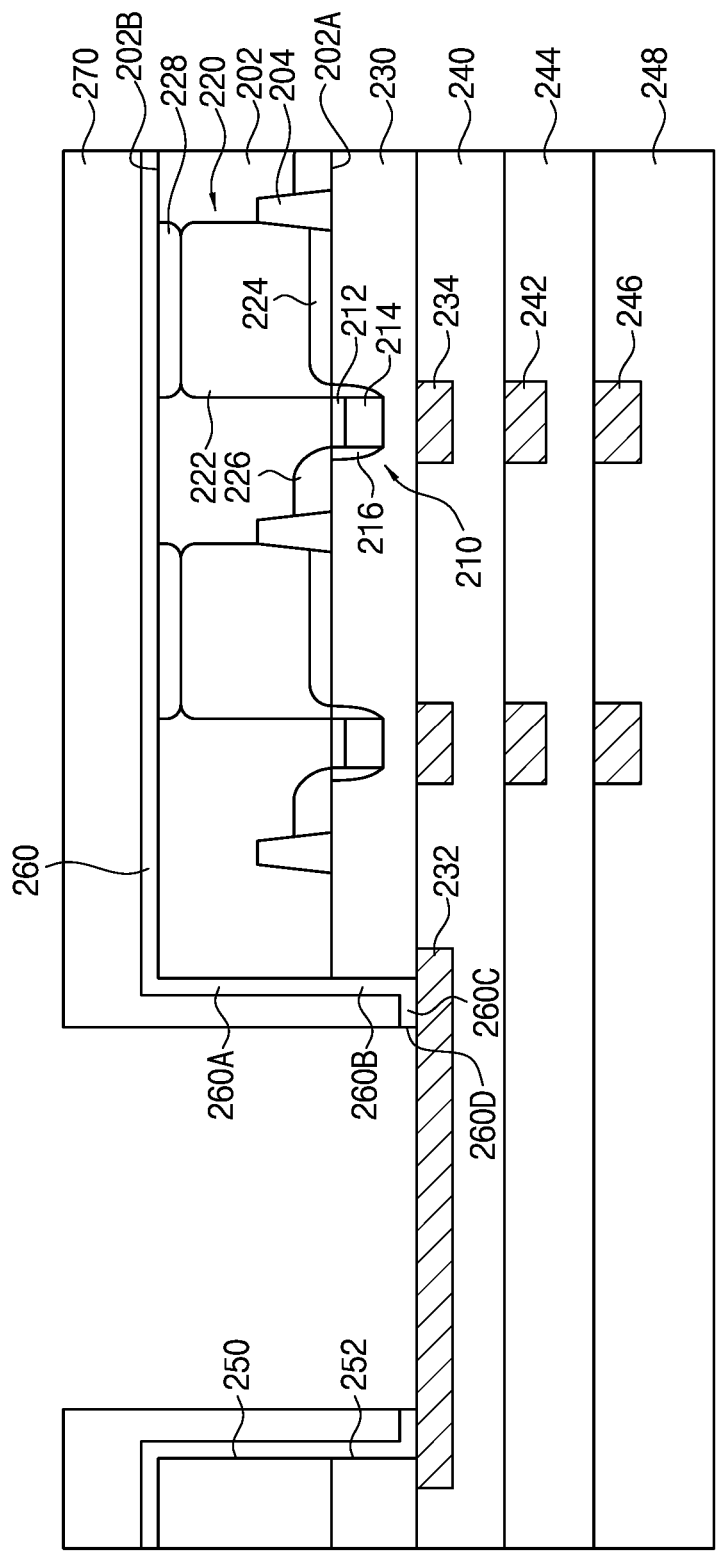

Referring to FIG. 18, the anti-reflective layer 260 may be partially removed so as to partially expose the backside surface of the bonding pad 232. For example, a second photoresist pattern 270 may be formed on the anti-reflective layer 260, which partially exposes a third portion 260C of the anti-reflective layer 260. Then, an etching process using the second photoresist pattern 270 as an etching mask may be performed to thereby form a through-hole 260D partially exposing the backside surface of the bonding pad 232. Particularly, the through-hole 260D of the anti-reflective layer 260 may have a width narrower than those of the first and second openings 250 and 252 so as to prevent the first and second portions 260A and 260B of the anti-reflective layer 260 from being damaged during the etching process. The second photoresist pattern 270 may be removed by an ashing or stripping process after forming the through-hole 260D.

Figure 19:
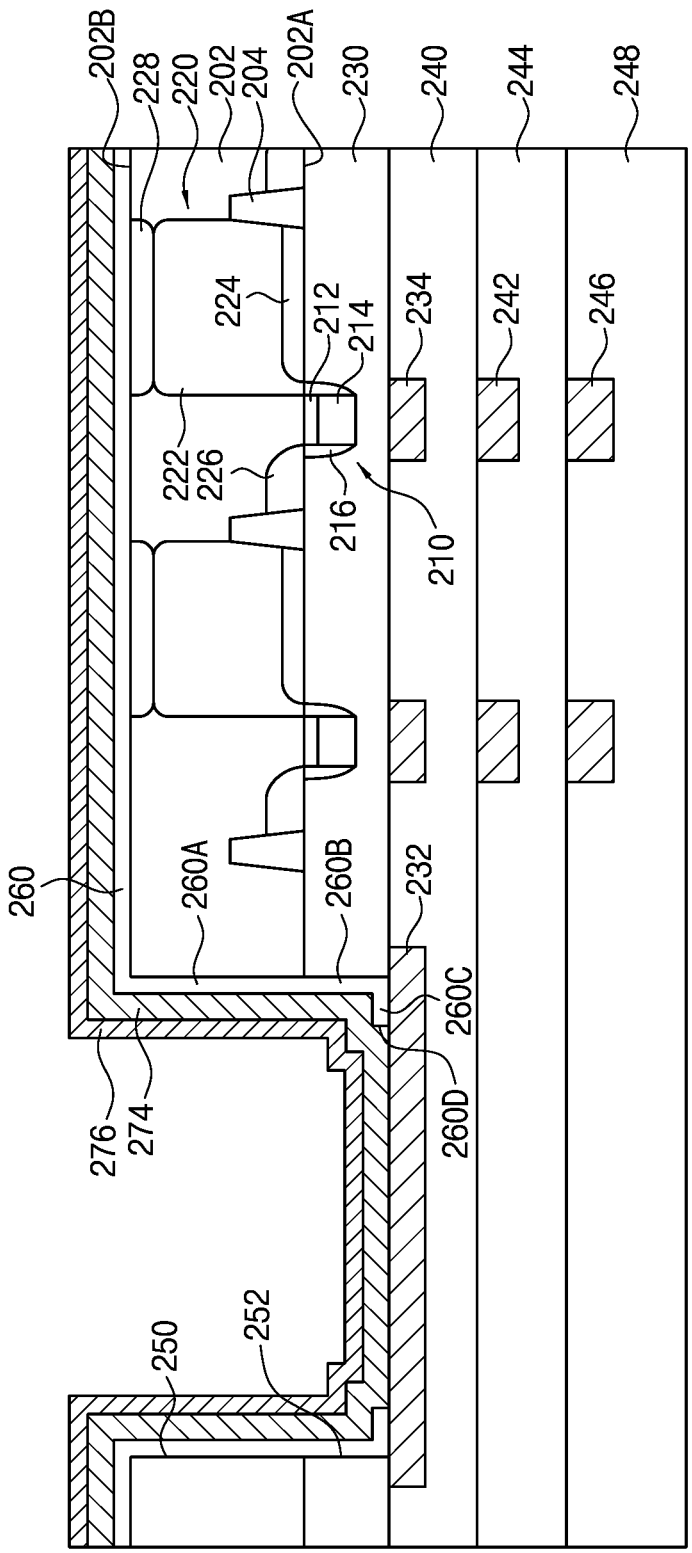
Figure 20:
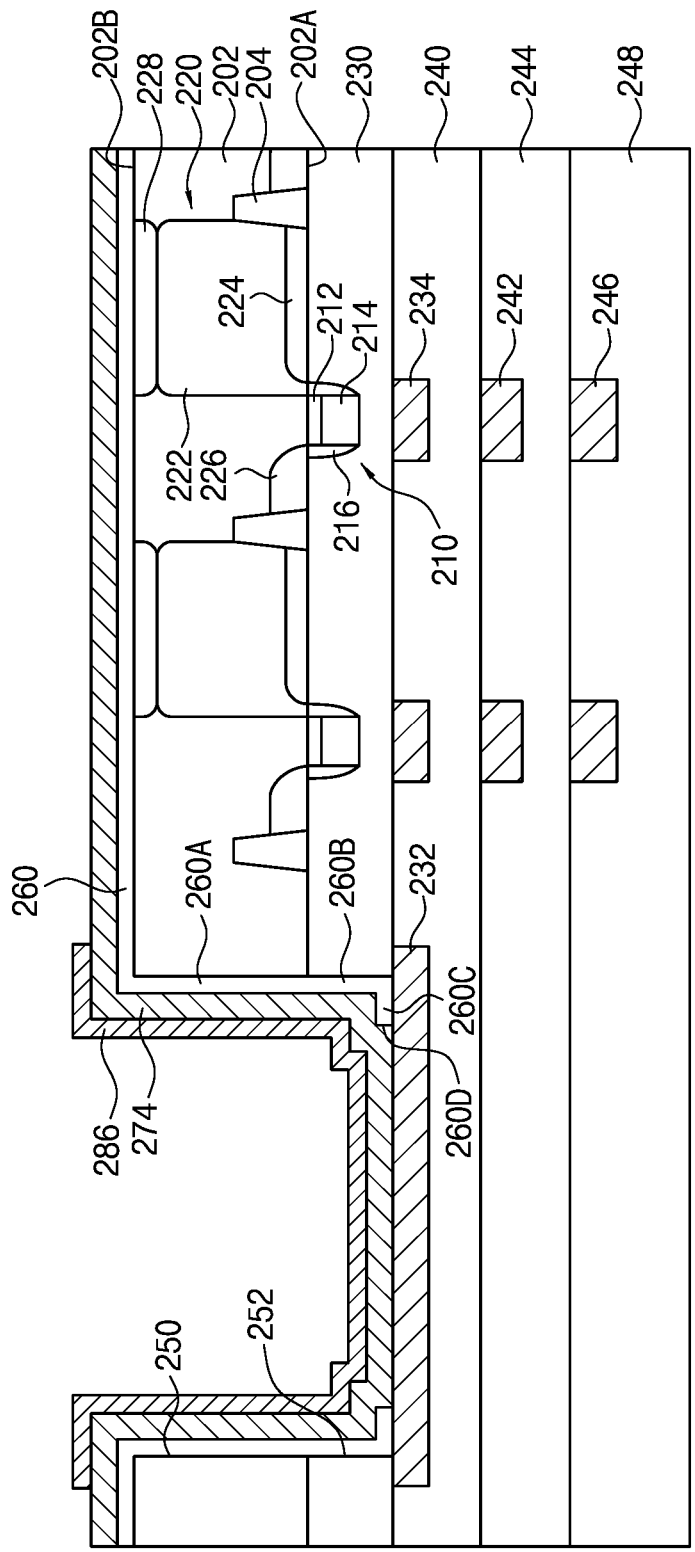
Figure 21:
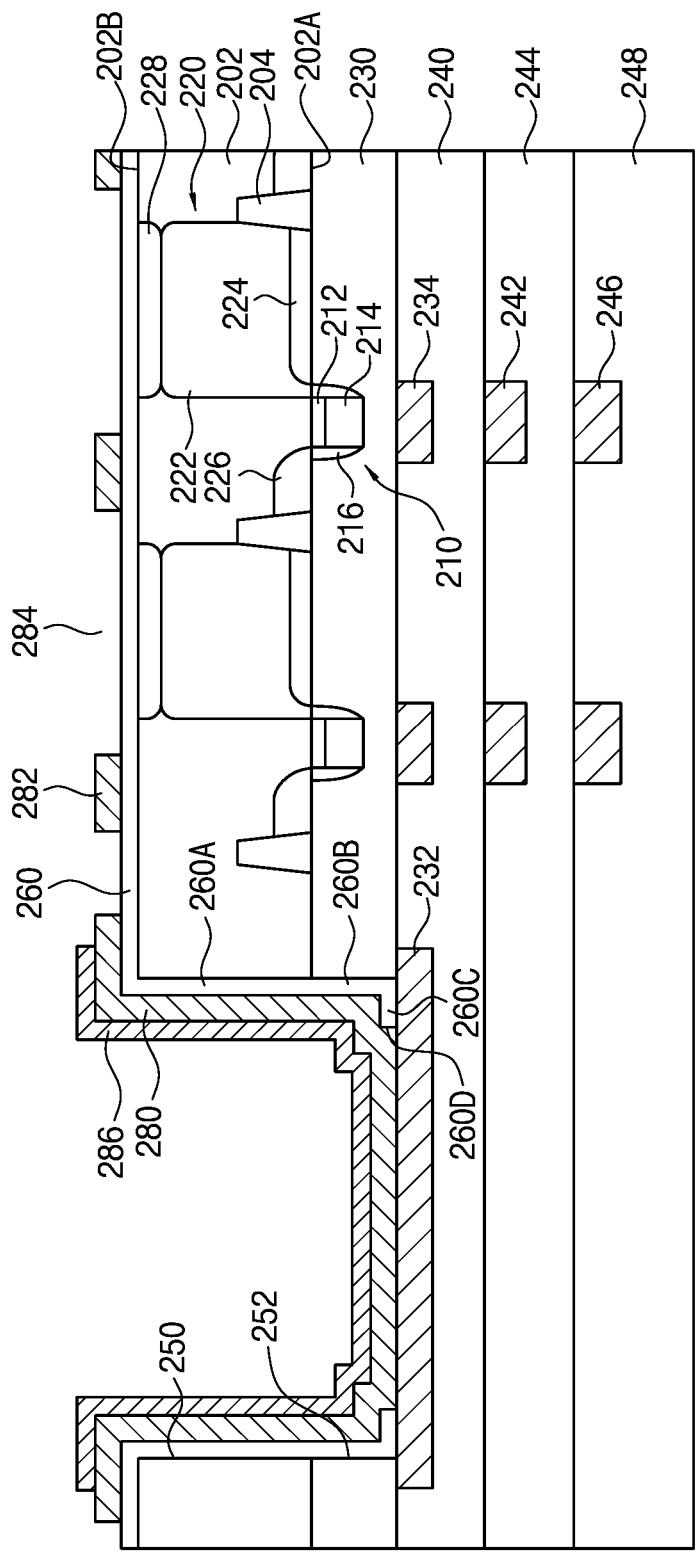

Referring to FIGS. 19 to 21, a second bonding pad 280 may be formed on the anti-reflective layer 260 and a backside surface portion of the bonding pad 232 exposed by the through-hole 260D, and a third bonding pad 286 may be formed on the second bonding pad 280. Further, a light-blocking pattern 282 having third openings 284 corresponding to the pixel regions 220 may be formed on the anti-reflective layer 260.

For example, as shown in FIG. 19, a first metal layer 274, e.g., a tungsten layer, may be formed on the anti-reflective layer 260 and the backside surface portion of the bonding pad 232, and a second metal layer 276, e.g., an aluminum layer, may be formed on the first metal layer 274. The third bonding pad 286 may be formed by patterning the second metal layer 276 as shown in FIG. 20, and the second bonding pad 280 and the light-blocking pattern 282 may be formed by patterning the first metal layer 274 as shown in FIG. 21.

Figure 22:
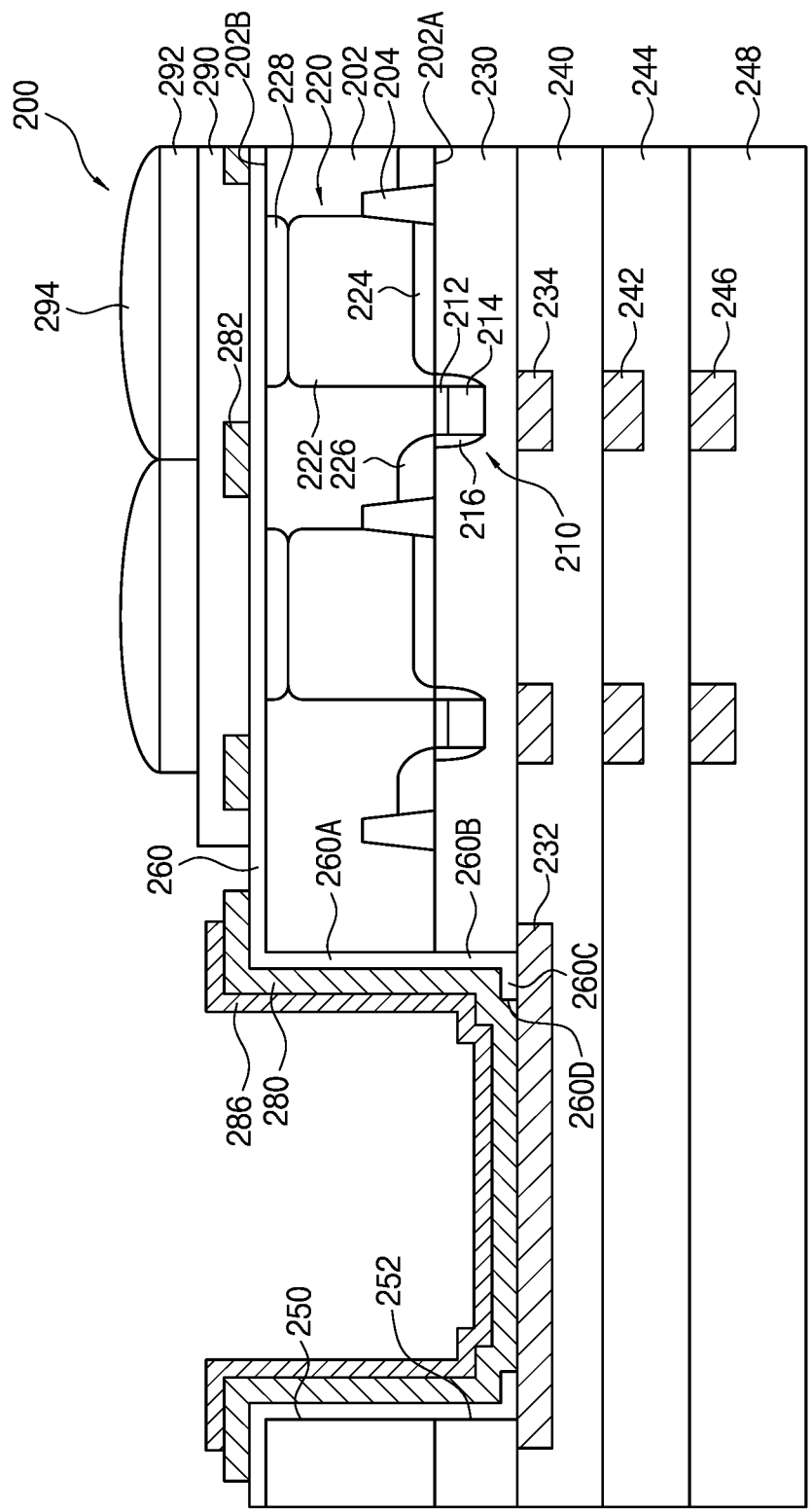

Referring to FIG. 22, a planarization layer 290 may be formed on the anti-reflective layer 260 and the light-blocking pattern 282, and a color filter layer 292 and a micro lens array 294 may be sequentially formed on the planarization layer 290. The planarization layer 290 may be made of an insulating material such as silicon oxide or photoresist material.

In accordance with the exemplary embodiments of the present disclosure as described above, the inner side surface of the first opening may be protected by the first portion of the anti-reflective layer. Thus, the distance between the pixel regions and the micro lens array may be reduced, and the sensitivity and crosstalk of the backside illuminated image sensor may be improved.

Although the backside illuminated image sensor and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A backside illuminated image sensor comprising:
a plurality of pixel regions disposed in a substrate defining a frontside surface and a backside surface;
an insulating layer defining a frontside surface and disposed on the frontside surface of the substrate;
a bonding pad disposed on the frontside surface of the insulating layer; and
an anti-reflective layer disposed on the backside surface of the substrate,
wherein the substrate defines a first opening for partially exposing a backside surface of the bonding pad, the insulating layer defines a second opening for partially exposing the backside surface of the bonding pad, and the anti-reflective layer has a first portion extending along an inner side surface of the first opening, and
a second bonding pad is disposed on the anti-reflective layer, an inner side surface of the second opening and a backside surface portion of the bonding pad exposed by the second opening, and a third bonding pad made of a material different from the second bonding pad is disposed on the second bonding pad.

2. The backside illuminated image sensor of claim 1, wherein the first opening has a width greater than that of the second opening, and the anti-reflective layer has a second portion disposed on a backside surface portion of the insulating layer exposed by the first opening.

3. The backside illuminated image sensor of claim 1, wherein the first opening has a same width as the second opening, and the anti-reflective layer has a second portion extending along an inner side surface of the second opening.

4. The backside illuminated image sensor of claim 1, wherein the second bonding pad is made of tungsten, and the third bonding pad is made of copper or aluminum.

5. The backside illuminated image sensor of claim 1, further comprising a light-blocking pattern disposed on the anti-reflective layer and having third openings corresponding to the pixel regions.

6. The backside illuminated image sensor of claim 5, wherein the second bonding pad is made of a same material as the light-blocking pattern.

7. The backside illuminated image sensor of claim 1, wherein the anti-reflective layer comprises:
a metal oxide layer disposed on the backside surface of the substrate;
a silicon oxide layer disposed on the metal oxide layer; and
a silicon nitride layer disposed on the silicon oxide layer.

8. The backside illuminated image sensor of claim 1, wherein each of the pixel regions comprises:
a charge accumulation region disposed in the substrate; and
a frontside pinning layer disposed between a frontside surface of the substrate and the charge accumulation region.

9. The backside illuminated image sensor of claim 8, wherein the each of the pixel regions further comprises a backside pinning layer disposed between the backside surface of the substrate and the charge accumulation region.

* * * * *